US012587009B2

(12) United States Patent
Goyal et al.

(10) Patent No.: US 12,587,009 B2
(45) Date of Patent: Mar. 24, 2026

(54) OVERSHOOT CURRENT DETECTION AND CORRECTION CIRCUIT FOR ELECTRICAL FAST TRANSIENT EVENTS

(71) Applicant: Texas Instruments Incorporated, Dallas, TX (US)

(72) Inventors: Shishir Goyal, Bengaluru (IN); Lokesh Kumar Gupta, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 42 days.

(21) Appl. No.: 18/522,644

(22) Filed: Nov. 29, 2023

(65) Prior Publication Data

US 2024/0097437 A1 Mar. 21, 2024

Related U.S. Application Data

(62) Division of application No. 16/411,251, filed on May 14, 2019, now Pat. No. 11,870,246.

(60) Provisional application No. 62/820,322, filed on Mar. 19, 2019.

(51) Int. Cl.
| | |
|---|---|
| *H02H 9/04* | (2006.01) |
| *G01R 19/10* | (2006.01) |
| *G01R 19/165* | (2006.01) |
| *H02H 1/00* | (2006.01) |
| *H03K 17/082* | (2006.01) |

(52) U.S. Cl.
CPC ............. *H02H 9/045* (2013.01); *G01R 19/10* (2013.01); *G01R 19/16571* (2013.01); *H02H*

*1/0007* (2013.01); *H03K 17/0822* (2013.01); *H03K 17/0826* (2013.01)

(58) Field of Classification Search
CPC ................................ H02H 9/045; G01R 19/10
See application file for complete search history.

(56) References Cited

U.S. PATENT DOCUMENTS

| | | | |
|---|---|---|---|
| 6,297,921 B1 | 10/2001 | Price, Jr | |
| 6,407,617 B1 | 6/2002 | Yanagihara | |
| 8,766,675 B1 | 7/2014 | Dreps | |

(Continued)

FOREIGN PATENT DOCUMENTS

| | | | | |
|---|---|---|---|---|
| JP | 2010010545 A | * | 1/2010 | |

*Primary Examiner* — Daniel C Puentes
(74) *Attorney, Agent, or Firm* — Xianghui Huang; Frank D. Cimino

(57) ABSTRACT

A positive overshoot detection circuit comprises a transistor coupled to a current mirror, a reference current source coupled to the current mirror, and a comparator coupled to the reference current source and the current mirror. The comparator output indicates whether the current mirror's current is greater than the reference current source's current. A control input and a current terminal of the transistor are coupled to a clamping circuit. A negative overshoot detection circuit comprises a biasing sub-circuit coupled to a transistor, a resistor coupled to the transistor, and a comparator coupled to the transistor and the resistor. The comparator output indicates whether the transistor is in an on or off state. The biasing sub-circuit is coupled to a clamping circuit. In some implementations, the comparator outputs from the positive and negative overshoot detection circuits are provided to a driver circuit, which modifies its operation.

20 Claims, 6 Drawing Sheets

(56) References Cited

U.S. PATENT DOCUMENTS

| 2012/0063041 | A1* | 3/2012 | Seth | ....................... | H02H 9/041 |
| | | | | | 361/56 |
| 2014/0355161 | A1* | 12/2014 | Torres | ...................... | H02H 9/02 |
| | | | | | 361/93.9 |

* cited by examiner

OVERSHOOT CURRENT DETECTION AND CORRECTION CIRCUIT FOR ELECTRICAL FAST TRANSIENT EVENTS

CROSS-REFERENCE TO RELATED APPLICATIONS

This application is a divisional of U.S. patent application Ser. No. 16/411,251, filed May 14, 2019, which claims priority to U.S. Provisional Application No, 62/820,322, filed Mar. 19, 2019, which are hereby incorporated by reference.

BACKGROUND

Wireline transceivers are used in a variety of applications, including motor position encoders, and transmit signals by creating a differential voltage on a bus line. A negative polarity voltage on the bus line corresponds to a logic low signal and a positive polarity voltage on the bus line corresponds to a logic high signal. Wireline transceivers are subjected to external interferences, such as electrical fast transients (EFT), which can cause sudden spikes in both current and voltage on the bus line. In applications such as motor encoders, the wireline transceivers are expected to maintain communication even while subjected to such interference.

Some wireline transceivers include a silicon controlled rectifier (SCR) which shunts a bad on the bus line to ground in response to a voltage on the bus line being greater than a triggering voltage of the SCR, such as in response to an EFT strike. After the EFT strike is over and the SCR decreases the voltage on the bus line below its triggering voltage, an EFT clamping circuit sinks the overshoot current from the EFT generating source during an overshoot period. However, this can prevent the driver from generating a differential voltage on the bus line during the overshoot period, resulting in missed bits. In some driver circuits, the EFT strike can corrupt other digital or analog signals, and impair operation of other circuits on the IC.

SUMMARY

In some implementations, an overshoot current detection circuit comprises a transistor, a current mirror coupled to the transistor, a reference current source coupled to the current mirror, and a comparator coupled to the reference current source and the current mirror. The transistor is configured to be coupled to a clamping circuit and provide a current from the clamping circuit to the current mirror. The comparator is configured to output a signal indicative of the current from the clamping circuit being greater than a current generated by the reference current source. A control input and a current terminal of the transistor are coupled to the clamping circuit.

In some implementations, an overshoot current detection circuit comprises a biasing sub-circuit, a transistor coupled to the biasing sub-circuit, a resistor coupled to the transistor, and a comparator coupled to the transistor and the resistor. The comparator is configured to output a signal indicative of whether the transistor is in an on state or an off state. The biasing sub-circuit is coupled to a clamping circuit, and in some implementations, comprises a diode coupled to a control input of the transistor, a second resistor coupled to a supply voltage and the diode, and a third resistor coupled to the diode and a common mode node.

In some implementations, a clamping and detection circuit includes a clamping circuit, a positive overshoot current detection circuit, and a negative overshoot current detection circuit. The output of the comparator in the positive overshoot current detection circuit and the output of the comparator in the negative overshoot current detection circuit are provided to a driver circuit, which modifies its operation based on the comparator outputs to ensure reliable data transmission.

BRIEF DESCRIPTION OF THE DRAWINGS

For a detailed description of various examples, reference will now be made to the accompanying drawings in which.

DETAILED DESCRIPTION

The disclosed overshoot current detection circuits detect EFT events and overshoot current through an EFT clamping circuit, and generate output signals indicating positive or negative overshoot current. The output signals are provided to associated driver circuits and prompt the drivers to boost current and by extension the differential voltage on the bus line caused by the drivers. The output signals also cause the drivers to override signals within the driver to ensure proper operation of the drivers during the overshoot period.

In some examples, a positive overshoot current detection circuit includes a transistor coupled to a clamping circuit and a current mirror. An output of the current mirror is coupled to a reference current source, both of which are coupled to a comparator. The transistor mimics current flow through the clamping circuit, which the current mirror inputs to the comparator. The reference current source generates a reference current below which the overshoot period is considered over. The comparator compares the current through the clamping circuit to the reference current and outputs a logic high signal in response to the current through the clamping circuit being greater than the reference current and a logic low signal in response to the current through the clamping circuit being less than the reference current. The comparator output is provided to driver circuits and used to modify operation of the driver circuits to ensure reliable transmission of data, such as increasing drive current or overriding outputs of comparators within the driver circuits.

In some examples, a negative overshoot current detection circuit includes a biasing sub-circuit coupled to a clamping circuit and a transistor. The transistor is further coupled to a resistor and a comparator, and turned off in response to a decrease in voltage in the clamping circuit. The comparator outputs a logic high signal in response to the transistor being off and a logic low signal in response to the transistor being on. The comparator output is provided to driver circuits and used to modify operation of the driver circuits to ensure reliable transmission of data, such as increasing driver current or overriding outputs of comparators within the driver circuits.

Figures 1, 2:
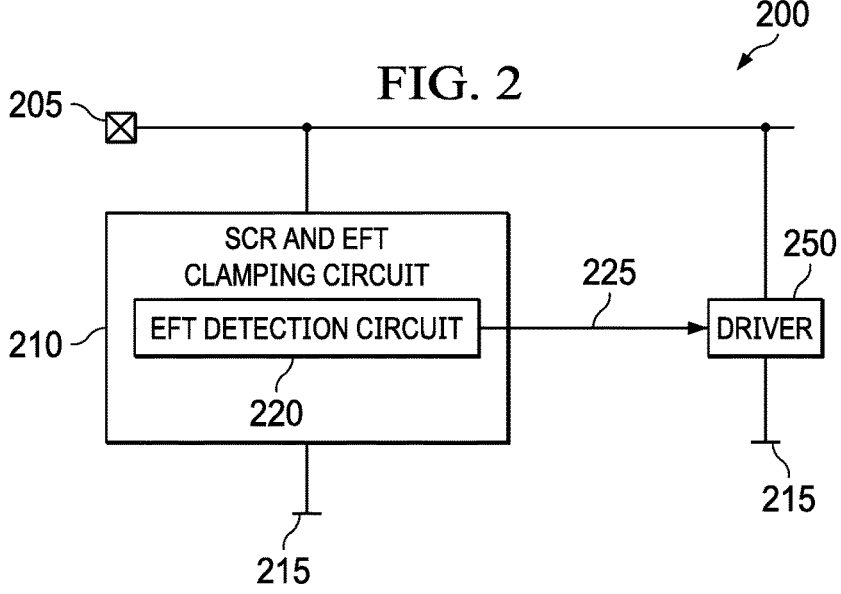
FIG. 1 shows a graph of voltage on a bus node of a driver circuit over time and current of an electrical fast transient (EFT) strike over time.
FIG. 2 illustrates a system diagram of an example driver in combination with a semiconductor controlled rectifier and a voltage clamp.

FIG. 1 shows a graph of voltage on a bus node Vbus 105 of a driver circuit over time and a graph of current of an electrical fast transient (EFT) strike, IEFT 110, over time. IEFT 110 decreases sharply at time t1, indicating an EFT strike on the bus node of the driver circuit. Vbus 105 increases sharply in response, in this example to nearly eighty volts (V). A semiconductor controlled rectifier (SCR) associated with the driver circuit shunts the bus load to a common mode node and protects it from the strong current of the EFT strike from time t1 to time t2. After the SCR decreases Vbus 105 below a triggering voltage of the SCR at t2, capacitors within the EFT generating source discharge from time t2 to time t3, the overshoot period, and an EFT clamping circuit associated with the driver circuit sinks the overshoot current from the capacitors. However, this can prevent the driver from generating a differential voltage on the bus during the overshoot period, resulting in missed bits during the overshoot period.

Depending on the magnitude of the energy of the EFT strike, components in the integrated circuit (IC), bus characteristics, and the like, the overshoot period from t2 to t3 can be very long, in this example two microseconds. For a ten megabits/second transmission rate, a two microsecond overshoot period prevents the driver from sending twenty bits of information. In some driver circuits, the EFT strike can corrupt other digital or analog signals, and impair operation of other circuits on the IC.

FIG. 2 illustrates a system diagram 200 of an example driver 250 in combination with an SCR and EFT clamping circuit 210. Driver 250 and SCR and EFT clamping circuit 210 are coupled to bus node 205 and to common mode node 215. In this example, SCR and EFT clamping circuit 210 includes an EFT detection circuit 220. In other examples, the EFT detection circuit 220 is coupled to a supply voltage node and common mode node 215, and configured to receive inputs from SCR and EFT clamping circuit 210. In response to an EFT strike at bus node 205, SCR and EFT clamping circuit 210 shunts a load on bus node 205 to common mode node 215, and EFT detection circuit 220 generates an EFT detection signal 225, which is provided to driver 250. Driver 250 adjusts its operation based on the changed voltage on bus node 205 and the EFT detection signal 225. In some examples, driver 250 increases its drive current to increase the differential voltage on bus node 205, and continues sending a data signal through bus node 205 without interruption. In some examples, bus driver 250 overrides control signals generated based on a voltage on bus node 205.

Figure 3B:
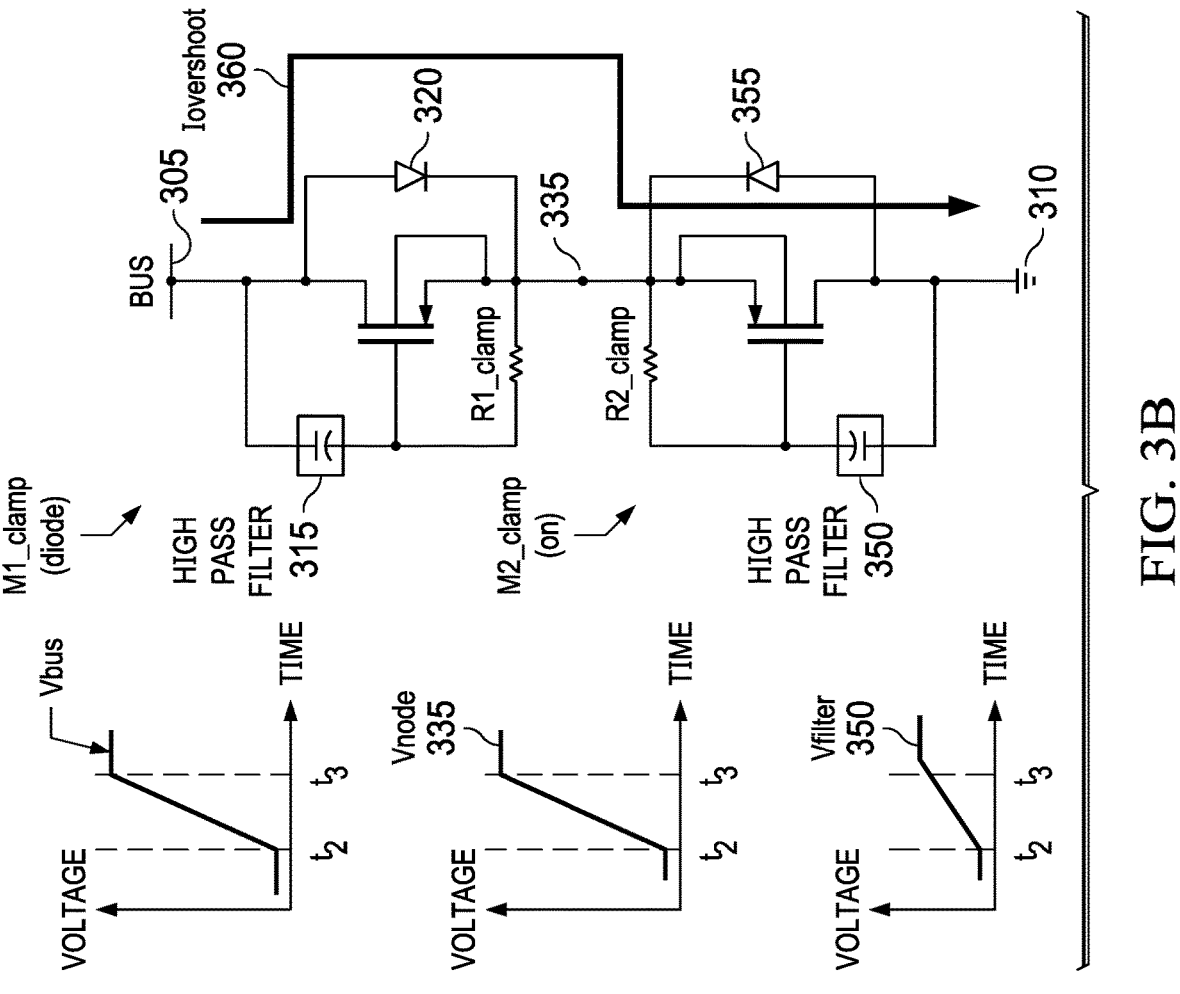
FIGS. 3A-C illustrate an example EFT clamping circuit in different modes of operation.
Figure 3A:
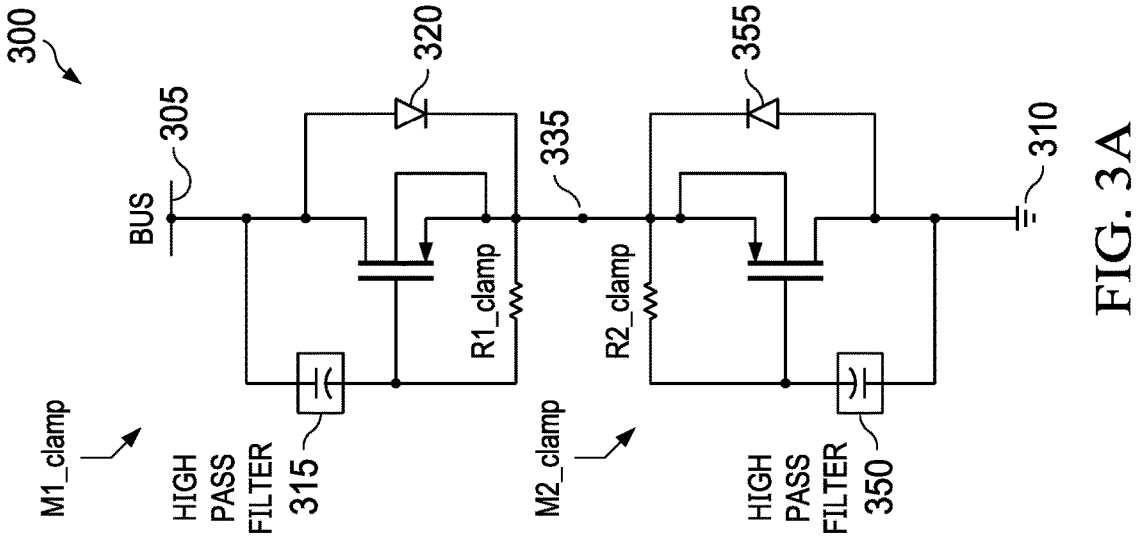
Figure 3C:
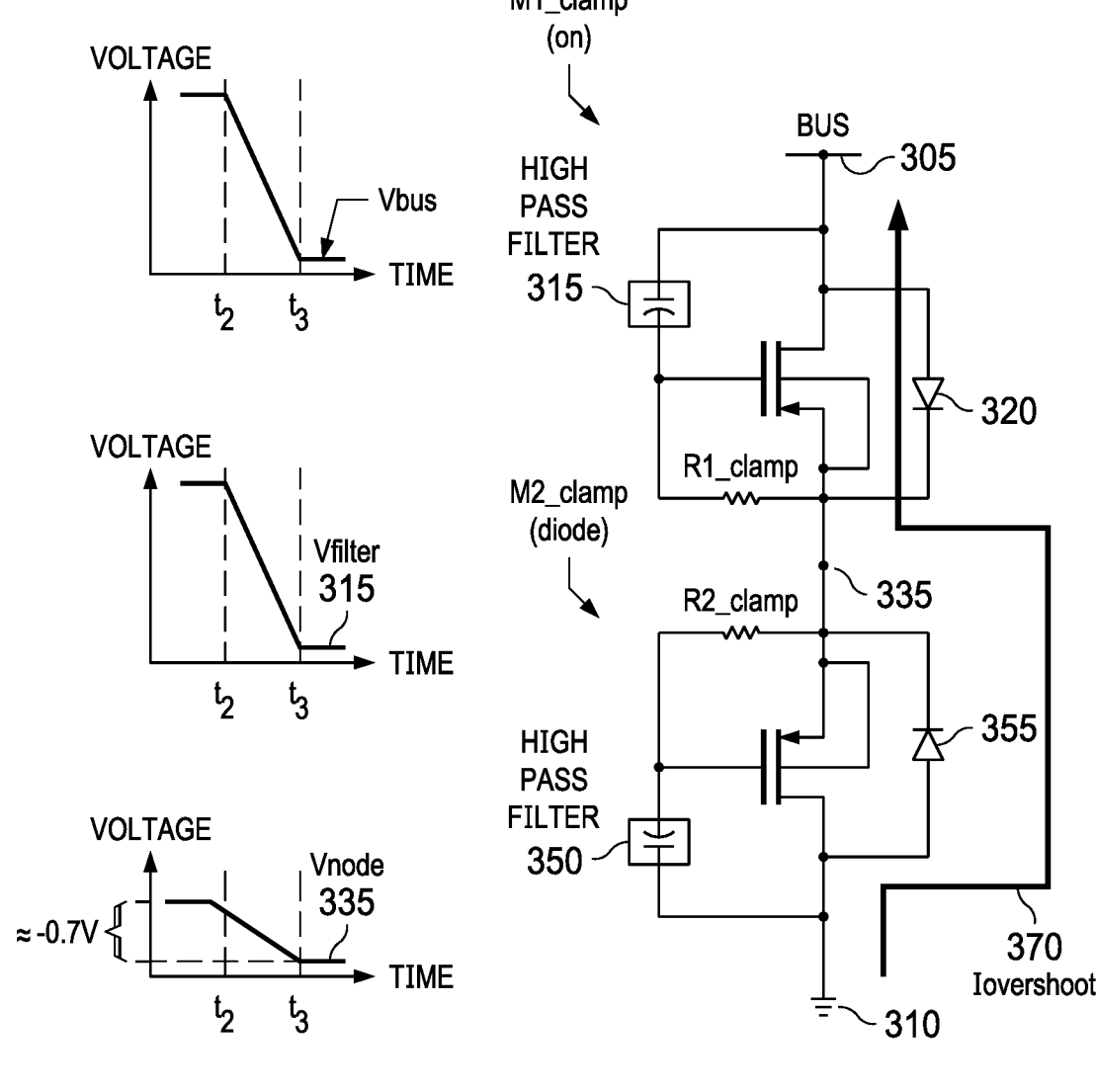

FIGS. 3A-C illustrate an example EFT clamping circuit 300 in different modes of operation. FIG. 3A illustrates an example EFT clamping circuit 300, which includes two transistors, two diodes, two resistors, and two high pass filters. The transistors M1_clamp and M2_clamp are metal oxide semiconductor field-effect transistors (MOSFETs). In this example, M1_clamp and M2_clamp are p-type MOS-FETs (PMOS). In other examples, M1_clamp and M2_clamp are n-type MOSFETs (NMOS). In other examples, one or more of M1_clamp and M2_clamp are bipolar junction transistors. Each bipolar junction transistor includes a control input (base) corresponding to the gate terminal, and a pair of current terminals (collector and emitter) corresponding to the drain and source terminals. M1_clamp and M2_clamp are chosen to withstand high voltages on bus node 305 and conduct high currents.

The drain terminal of M1_clamp is coupled to bus node 305, and the source terminal of M1_clamp is coupled to node 335. High pass filter 315 is coupled between the gate and drain terminals of M1_clamp, and R1_clamp is coupled between the gate and source terminals of M1_clamp. High pass filter 315 couples fast transients on bus node 305 to the gate terminal of M1_clamp. Diode 320 is coupled to the source and drain terminals of M1_clamp. The drain terminal of M2_clamp is coupled to common mode node 310, and the source terminal of M2_clamp is coupled to node 335. High pass filter 350 is coupled between the gate and drain terminals of M2_clamp, and R2_clamp is coupled between the gate and source terminals of M2_clamp. High pass filter 350 couples fast transients on common mode node 310 to the gate terminal of M2_clamp. Diode 355 is coupled to the source and drain terminals of M2_clamp.

FIG. 3B illustrates operation of example EFT clamping circuit 300 in response to a negative EFT strike, causing a positive overshoot current Iovershoot 360. The positive overshoot current Iovershoot 360 flows from bus node 305 to common mode node 310, while M1_clamp acts as a diode and M2_clamp turns on in response to the gate to source voltage built up by the negative EFT strike. The voltage on bus node 305 and the voltage on node 335 increase in response to the negative EFT strike. The voltage across high pass filter 350 increases such that the voltage on the gate terminal of M2_clamp remains logic low and M2_clamp is kept on.

FIG. 3C illustrates operation of example EFT clamping circuit 300 in response to a positive EFT strike, causing a negative overshoot current Iovershoot 370. The negative overshoot current Iovershoot 370 flows from common mode node 310 to bus node 305, while M2_clamp acts as a diode and M1_clamp turns on in response to the gate to source voltage built up by the positive EFT strike. The voltage on bus node 305 and the voltage at the gate terminal of M1_clamp decrease in response to the positive EFT strike. The voltage across M2_clamp decreases to approximately −0.7V, the voltage drop across diode 355.

Figure 4:
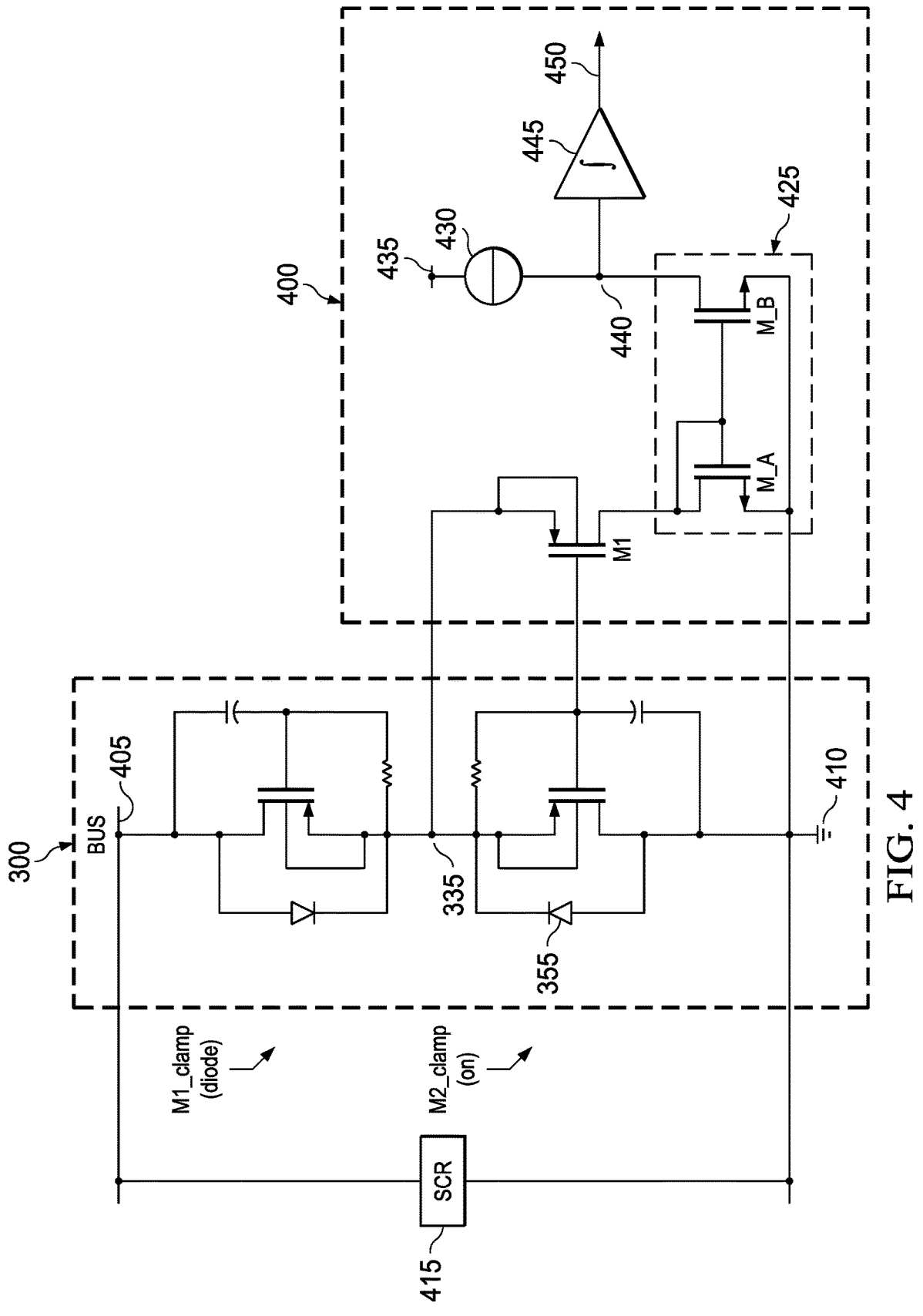
FIG. 4 illustrates an example positive overshoot current detection circuit in combination with the example EFT clamping circuit of FIG. 3.

FIG. 4 illustrates an example positive overshoot detection circuit 400 in combination with the example EFT clamping circuit 300 described in FIG. 3. An SCR circuit 415 and the example EFT clamping circuit 300 are coupled to a bus node 405 and a common mode node 410. The example positive overshoot detection circuit 400 includes a PMOS transistor M1, a diode 420, a current mirror 425, a reference current source 430, and a comparator 445. In some examples, M1 is an NMOS transistor. In other examples, M1 is a bipolar junction transistor. The bipolar junction transistor includes a control input (base) corresponding to the gate terminal, and a pair of current terminals (collector and emitter) corresponding to the drain and source terminals.

The source terminal of M1 is coupled to the source terminals of M1_clamp and M2_clamp at node 335 in EFT clamping circuit 300. The gate terminal of M1 is coupled to the gate terminal of M2_clamp, and the drain terminal of M1 is coupled to current mirror 425. In some examples, current mirror 425 includes NMOS transistors M_A and M_B. In other examples, M_A and M_B are PMOS transistors. In other examples, one or more of M_A and M_B are bipolar junction transistors. The gate terminals of M_A and M_B are coupled together and to the drain terminal of M1. The drain terminal of M_A is coupled to the drain terminal of M1, and the source terminal of M_A is coupled to common mode node 410. The source terminal of M_B is coupled to common mode node 410, and the drain terminal of M_B is coupled to reference current source 430 at node 440. Reference current source 430 is further coupled to a supply voltage node 435. In this example, reference current source 430 generates a reference current of approximately 100 milliamps (mA).

Comparator 445 is coupled to reference current source 430 and current mirror 425 at node 440. Comparator 445 outputs an EFT_POS signal 450, which is logic high in response to a current flowing through M2_clamp being greater than the 100 mA reference current produced by reference current source 430 and logic low in response to a current flowing through M2_clamp being less than the 100 mA reference current produced by reference current source 430. The EFT_POS signal 450 generated by comparator 445 is provided to other circuits within the IC, prompting adjustments in operation of the other circuits.

In response to an EFT strike on bus node 405, SCR circuit 415 shunts a load on bus node 405 to common mode node 410. After the magnitude of the voltage on bus node 405 decreases below the triggering voltage of SCR 415, EFT clamping circuit 300 conducts current during the overshoot period. In this example, 2-3 A of current are conducted through EFT clamping circuit 300. A negative EFT strike causes M1_clamp to act as a diode and M2_clamp to be on, as shown in FIG. 3B. The positive overshoot current flows from bus node 405 to common mode node 410, and current flowing through M2_clamp is greater than the reference current provided by reference current source 430. This prompts positive overshoot detection circuit 400 to output EFT_POS signal 450 as logic high, indicating a negative EFT strike occurred and positive overshoot current is occurring.

Figure 5:
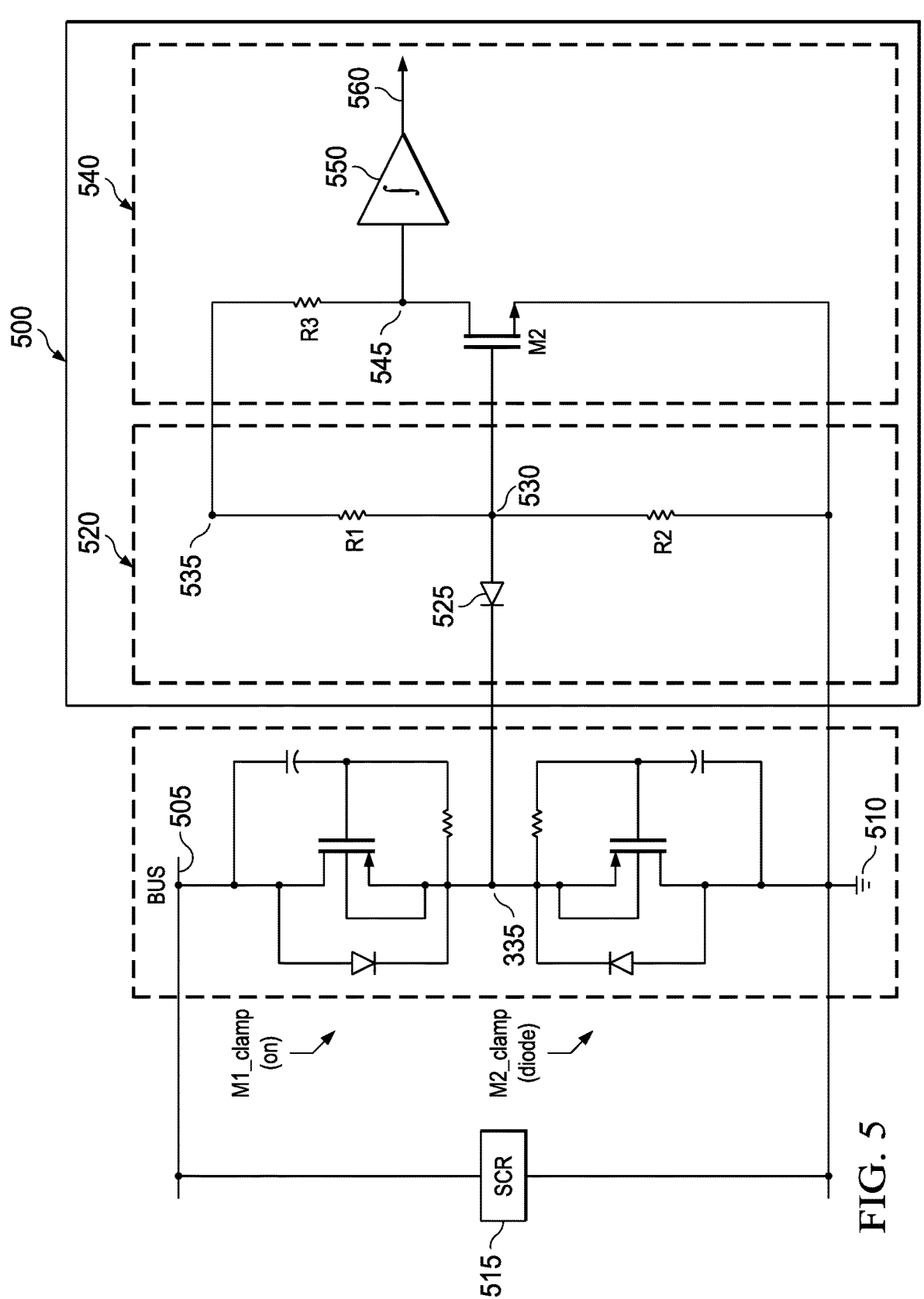
FIG. 5 illustrates an example negative overshoot current detection circuit in combination with the example EFT clamping circuit of FIG. 3.

FIG. 5 illustrates an example negative overshoot detection circuit 500 in combination with the example EFT clamping circuit 300 of FIG. 3. An SCR circuit 515 and example EFT clamping circuit 300 are coupled to a bus node 505 and a common mode node 510. The example negative overshoot detection circuit 500 includes a biasing sub-circuit 520 and a detection sub-circuit 540. The biasing sub-circuit 520 includes a diode 525 and resistors R1 and R2. The detection sub-circuit 540 includes an NMOS transistor M2, a resistor R3, and comparator 550. In some examples, M2 is a PMOS transistor. In other examples, M2 is a bipolar junction transistor. The bipolar junction transistor includes a control input (base) corresponding to the gate terminal, and a pair of current terminals (collector and emitter) corresponding to the drain and source terminals.

In biasing sub-circuit 520, diode 525 is coupled to the source terminals of M1_clamp and M2_clamp at node 335 in EFT clamping circuit 300. Diode 525 is further coupled to node 530. R1 is coupled between a supply voltage node 535 and node 530. R2 is coupled between node 530 and common mode node 510. In detection sub-circuit 540, the gate terminal of M2 is coupled to node 530 in biasing sub-circuit 520. The source terminal of M2 is coupled to common mode node 510. R3 is coupled to supply voltage node 535 and to the drain terminal of M2 at node 545. Comparator 550 is coupled to R3 and the drain terminal of M2 at node 545. Comparator 550 outputs an EFT_NEG signal 560, which is logic high in response to a negative voltage on node 335 in EFT clamping circuit 300 and logic low in response to a positive voltage on node 335 in EFT clamping circuit 300. The EFT_NEG signal 560 generated by comparator 550 is provided to other circuits within the IC, prompting adjustments in operation of the other circuits.

During normal operation, the voltage on node 335 of EFT clamping circuit 300 is approximately Vcc (R1/R1+R2), where Vcc represents a voltage on supply voltage node 535.

This causes the voltage on the gate terminal of M2 to be logic high, prompting M2 to act as a closed switch. In response to M2 acting as a closed switch, current flows from supply voltage node 535 through R3 to common mode node 510, and EFT_NEG signal 560 generated by comparator 550 is logic low.

In response to an EFT strike on bus node 505, SCR circuit 515 shunts a load on bus node 505 to a common mode node 510. After the magnitude of the voltage on bus node 505 decreases below the triggering voltage of SCR 515, EFT clamping circuit 300 conducts current during the overshoot period. In this example, 2-3 A of current are conducted through EFT clamping circuit 300. A positive EFT strike causes M2_clamp to act as a diode and M1_clamp to be on, as shown in FIG. 3C. The negative discharge current flows from common mode node 510 to bus node 505, causing a voltage on node 335 to be approximately the threshold voltage of diode 355, in this example approximately −0.7 V. This causes the voltage on the gate terminal of M2 to be logic low, prompting M2 to turn off and act as an open switch. In response to M2 acting as an open switch, current flows from supply voltage node 535 through R3 to comparator 550. This causes EFT_NEG signal 560 to be logic high, indicating a positive EFT strike occurred and negative overshoot current is occurring.

A driver receiving EFT_POS signal 450 and EFT_NEG signal 560 increases its drive current in response to either EFT_POS signal 450 or EFT_NEG signal 560 being logic high. This allows the driver to increase the differential voltage on the bus node and continue signal transmission during the overshoot period. In response to both EFT_POS signal 450 and EFT_NEG signal 560 being logic low, indicating the overshoot period is over, the driver decreases its drive current to normal levels. In one example, the driver increases its drive current above a DC short circuit current threshold, for example 250 mA, during the overshoot period and decreases its drive current below the 250 mA threshold after the overshoot period is over. Because the driver cannot sustain the increased current for long periods of time, EFT_POS signal 450 and EFT_NEG signal 560 are used to indicate the end of the overshoot period and a return to normal operation. This allows the driver to briefly increase its drive current in response to the overshoot period, but return to normal operation in response to normal voltage and differential voltage on the bus node before the increased current causes the driver to malfunction.

Some drivers include comparators configured to compare a voltage on the bus node to a reference voltage. However, in the event of an EFT strike and the resulting overshoot period, fast transients on the bus node can cause the comparators to give incorrect outputs, leading to a further decrease in the differential voltage on the bus node and by extension additional missed bits. A driver receiving the EFT_POS signal 450 and EFT_NEG signal 560 can use those signals to override comparator outputs to ensure proper operation of the driver despite the unreliability of the comparators during an EFT strike and the resulting overshoot period.

Figure 6:
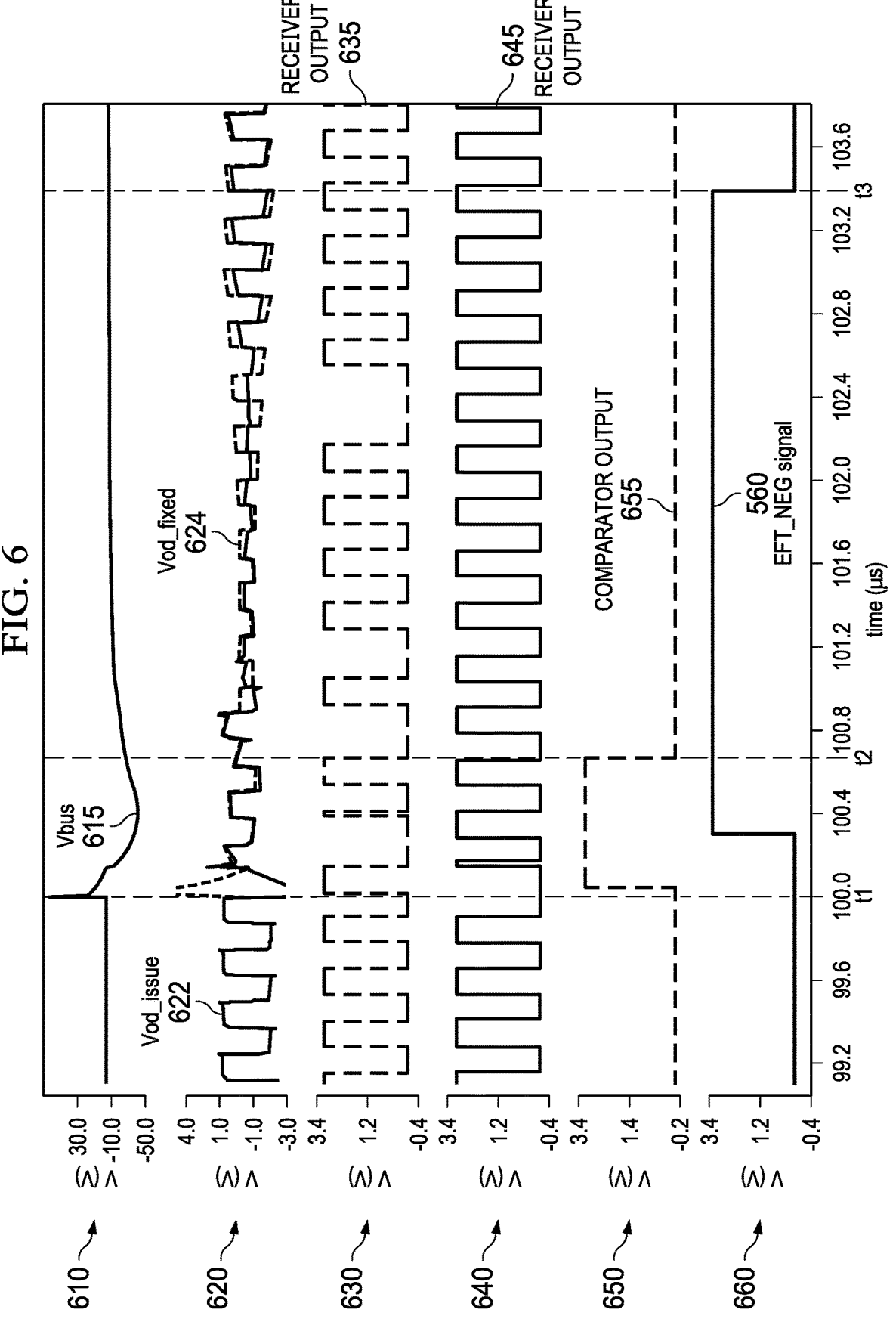
FIG. 6 shows graphs of voltages on nodes within an example driver and an example negative overshoot current detection circuit, as well as receiver outputs, over time.

FIG. 6 shows graphs of voltages on nodes within an example driver and within example negative overshoot detection circuit 500 described in FIG. 5, as well as receiver outputs, over time. Graph 610 shows the voltage on a bus node Vbus 615 before and during a positive EFT strike, and during an overshoot period. At time t1, a positive EFT strike occurs, and Vbus 615 spikes sharply. The overshoot period occurs between time t1 and time t3, after which Vbus node 615 returns to normal. Graph 620 shows the differential voltage on a bus node without EFT detection, Vod_issue 622, and the differential voltage on a bus node with EFT detection, Vod_fixed 624. Vod_issue 622 has a smaller voltage swing than Vod_fixed 624 during the overshoot period between time t1 and time t3. Negative overshoot detection circuit 500 generates a logic high EFT_NEG signal 560, prompting the driver to increase its drive current and by extension its differential voltage Vod_fixed 624.

Graph 630 shows a receiver output 635 from a receiver coupled to a bus and a driver without EFT detection, that receives Vod_issue 622. The decrease in Vod_issue 622 during the overshoot period causes the receiver to miss several bits. In contrast, graph 640 shows a receiver output 645 from a receiver coupled to a bus and a driver with EFT detection, that receives Vod_fixed 622. Because negative overshoot detection circuit 500 and the logic high EFT-_NEG signal 560 prompt the driver to increase its drive current and the differential voltage Vod_fixed 624, the receiver continues to receive the signal from the driver without error or missed bits.

Graph 650 shows a comparator output 655 from a comparator within the driver configured to compare the voltage on the bus node to a reference voltage, in this example ground. At time t1, comparator output 655 goes logic high in response to the EFT strike. However, at time t2, comparator output 655 goes logic low even though Vbus 615 is less than zero. Transients on the bus node from the EFT strike cause the comparator output 655 to be wrong. However, a driver with EFT detection can override the comparator output 655 with the EFT detection signal. Graph 660 shows EFT_NEG signal 560 from negative overshoot detection circuit 500. Before time t2, EFT_NEG signal 560 goes logic high in response to the changing voltage in an associated EFT clamping circuit. EFT_NEG signal 560 remains logic high until time t3, the end of the overshoot period. The driver with EFT detection can override the wrong comparator output 655 with the EFT_NEG signal 560 during the overshoot period and ensure proper operation of the driver.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. An overshoot current detection circuit, comprising:
a first transistor configured to be coupled to a clamping circuit between a second current terminal of a second transistor of the clamping circuit and a first current terminal of a third transistor of the clamping circuit, the first transistor configured to provide a current from the clamping circuit to a current mirror in response to the third transistor turning on;
the current mirror coupled to the first transistor and configured to mirror the current from the clamping circuit;
a reference current source coupled to the current mirror; and
a comparison device coupled to the reference current source and the current mirror and configured to compare a current from the reference current source to the current from the clamping circuit.

2. The overshoot current detection circuit of claim 1, wherein the comparison device is configured to output, to an input of a driver circuit, a signal indicative of the current from the clamping circuit being greater than the current from the reference current source.

3. The overshoot current detection circuit of claim 1, wherein the first transistor is a p-type metal oxide semiconductor field effect transistor.

4. The overshoot current detection circuit of claim 1, wherein the first transistor is a bipolar junction transistor.

5. The overshoot current detection circuit of claim 1, wherein a control input and a current terminal of the first transistor are coupled to the clamping circuit.

6. The overshoot current detection circuit of claim 1, wherein the current mirror comprises a fourth transistor and a fifth transistor coupled to the fourth transistor.

7. The overshoot current detection circuit of claim 6, wherein the fourth and the fifth transistors are n-type metal oxide semiconductor field effect transistors.

8. The overshoot current detection circuit of claim 1, wherein an output of the comparison device is provided to a driver circuit.

9. The overshoot current detection circuit of claim 1, wherein a control terminal of the first transistor is configured to be coupled to a control terminal of the third transistor.

10. The overshoot current detection circuit of claim 9, wherein the control terminal of the first transistor is configured to be coupled to the first current terminal of the third transistor.

11. A circuit comprising:
a clamping sub-circuit comprising:
a first transistor having a first current terminal, a second current terminal, and a control terminal; and
a second transistor having a first current terminal, a second current terminal, and a control terminal, the first current terminal of the second transistor coupled to the second current terminal of the first transistor; and
a positive overshoot current detection sub-circuit comprising:
a third transistor having a first current terminal, a second current terminal, and a control terminal, the first current terminal of the third transistor coupled to the second current terminal of the first transistor and the first current terminal of the second transistor, the control terminal of the third transistor coupled to the control terminal of the second transistor;
a current mirror having a first terminal and a second terminal, the first terminal of the current mirror coupled to the second current terminal of the third transistor;
a reference current source coupled to the second terminal of the current mirror; and
a comparison device having a first terminal coupled to the reference current source and the second terminal of the current mirror.

12. The circuit of claim 11, further comprising:
a driver circuit having a first terminal and a second terminal, the first terminal of the driver circuit coupled to a bus terminal, the second terminal of the driver circuit coupled to a second terminal of the comparison device.

13. The circuit of claim 12, the first current terminal of the first transistor coupled to the bus terminal.

14. The circuit of claim 11, the comparison device being a first comparison device, the circuit further comprising:

a negative overshoot current detection sub-circuit comprising:

a biasing sub-circuit having a first terminal, a second terminal, and a third terminal, the first terminal of the biasing sub-circuit coupled to the second current terminal of the first transistor and the first current terminal of the second transistor;

a fourth transistor having a first current terminal, a second current terminal, and a control terminal, the control terminal of the fourth transistor coupled to the second terminal of the biasing sub-circuit;

a resistor having a first terminal and a second terminal, the first terminal of the resistor coupled to the third terminal of the biasing sub-circuit, the second terminal of the resistor coupled to the first current terminal of the fourth transistor; and a second comparison device having a first terminal coupled to the first current terminal of the fourth transistor and the second terminal of the resistor.

15. The circuit of claim 11, the clamping sub-circuit further comprising:

a first resistor coupled between the control terminal and the second current terminal of the first transistor; and a second resistor coupled between the control terminal and the first current terminal of the second transistor.

16. The circuit of claim 15, the clamping sub-circuit further comprising:

a first high pass filter coupled to the control terminal and the first current terminal of the first transistor; and a second high pass filter coupled to the control terminal and the second current terminal of the second transistor.

17. A circuit comprising:

a current mirror having a first terminal and a second terminal;

a first transistor having a first current terminal, a second current terminal, and a control terminal, the first current terminal of the first transistor adapted to be coupled to a second current terminal of a second transistor and a first current terminal of a third transistor, the second current terminal of the first transistor coupled to the first terminal of the current mirror, the control terminal of the first transistor adapted to be coupled to a control terminal of the third transistor;

a reference current source coupled to the second terminal of the current mirror; and a comparison device having a first terminal and a second terminal, the first terminal of the comparison device coupled to the reference current source and the second terminal of the current mirror, the second terminal of the comparison device adapted to be coupled to a driver circuit.

18. The circuit of claim 17, the comparison device being a first comparison device, the circuit further comprising:

a biasing sub-circuit having a first terminal, a second terminal, and a third terminal, the first terminal of the biasing sub-circuit adapted to be coupled to the second current terminal of the second transistor and the first current terminal of the third transistor;

a fourth transistor having a first current terminal, a second current terminal, and a control terminal, the control terminal of the fourth transistor coupled to the second terminal of the biasing sub-circuit;

a resistor having a first terminal and a second terminal, the first terminal of the resistor coupled to the third terminal of the biasing sub-circuit, the second terminal of the resistor coupled to the first current terminal of the fourth transistor; and a second comparison device having a first terminal and a second terminal, the first terminal of the second comparison device coupled to the first current terminal of the fourth transistor and the second terminal of the resistor, the second terminal of the comparison device adapted to be coupled to the driver circuit.

19. The circuit of claim 17, the second transistor having a first current terminal coupled to a bus terminal, the driver circuit having a first input coupled to the bus terminal, the second terminal of the comparison device adapted to be coupled to the driver circuit at a second input of the driver circuit.

20. The circuit of claim 17, the first current terminal of the first transistor adapted to be coupled to the control terminal of the third transistor and a control terminal of the second transistor.

* * * * *